United States Patent
Zhong et al.

(10) Patent No.: US 10,615,822 B1
(45) Date of Patent: Apr. 7, 2020

(54) SYSTEMS AND METHODS FOR DYNAMIC ITERATION CONTROL IN A LOW-DENSITY PARITY-CHECK (LDPC) DECODER

(71) Applicant: NXP USA, Inc., Austin, TX (US)

(72) Inventors: Yan Zhong, San Jose, CA (US); Mao Yu, San Jose, CA (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/957,113

(22) Filed: Apr. 19, 2018

Related U.S. Application Data

(63) Continuation of application No. 14/829,257, filed on Aug. 18, 2015, now Pat. No. 9,966,972.

(60) Provisional application No. 62/044,849, filed on Sep. 2, 2014.

(51) Int. Cl.
*H03M 13/00* (2006.01)
*H03M 13/11* (2006.01)
*H03M 13/35* (2006.01)
*H04L 1/00* (2006.01)
*H03M 13/37* (2006.01)

(52) U.S. Cl.
CPC ..... *H03M 13/1128* (2013.01); *H03M 13/353* (2013.01); *H03M 13/616* (2013.01); *H04L 1/0051* (2013.01); *H03M 13/3746* (2013.01); *H03M 13/3753* (2013.01); *H04L 1/005* (2013.01)

(58) Field of Classification Search
CPC .......... H03M 13/1128; H03M 13/353; H03M 13/616; H03M 13/3753; H03M 13/3746; H04L 1/0051; H04L 1/005
See application file for complete search history.

(56) References Cited

U.S. PATENT DOCUMENTS

| | | | | |
|---|---|---|---|---|
| 5,491,480 A | * | 2/1996 | Jan | H03M 7/425 341/65 |
| 5,563,920 A | * | 10/1996 | Fimoff | H04N 19/46 375/354 |
| 6,724,327 B1 | * | 4/2004 | Pope | H03M 13/00 341/50 |
| 2003/0135809 A1 | | 7/2003 | Kim | |
| 2008/0148133 A1 | | 6/2008 | Duggan | |
| 2009/0256622 A1 | | 10/2009 | Roberts | |
| 2013/0007554 A1 | | 1/2013 | Chen et al. | |
| 2013/0128807 A1 | | 5/2013 | Vermani et al. | |
| 2013/0166984 A1 | | 6/2013 | Scarpa et al. | |
| 2015/0381315 A1 | | 12/2015 | Thomson et al. | |

* cited by examiner

*Primary Examiner* — Samir W Rizk

(74) *Attorney, Agent, or Firm* — Haley Guiliano LLP

(57) ABSTRACT

Systems and methods described herein provides a method for dynamically allocating an iteration number for a decoder. The method includes receiving, at an input buffer, an input signal including at least one data packet. The method further includes calculating a first iteration number for decoding the at least one data packet. The method further includes monitoring at least one of available space of the input buffer and available decoding time for the at least one data packet. The method further includes dynamically adjusting the first iteration number to a second iteration number based on the available space or the available decoding time to continue decoding the at least one data packet.

20 Claims, 13 Drawing Sheets

SYSTEMS AND METHODS FOR DYNAMIC ITERATION CONTROL IN A LOW-DENSITY PARITY-CHECK (LDPC) DECODER

CROSS-REFERENCE TO RELATED APPLICATION

This disclosure is a continuation of and claims priority to U.S. Non-Provisional application Ser. No. 14/829,257, filed Aug. 18, 2015 (now allowed), which in turn claims the benefit of U.S. Provisional Patent Application No. 62/044,849, filed Sep. 2, 2014. The aforementioned applications are hereby incorporated by reference herein in their entireties.

FIELD OF USE

This disclosure relates to a decoding scheme in a wireless data transmission system, for example, a wireless local area network (WLAN) implementing the IEEE 802.11 standard, which can be used to provide wireless transfer of data in outdoor deployments, outdoor-to-indoor communications, and device-to-device (P2P) networks.

BACKGROUND OF THE DISCLOSURE

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the present disclosure.

Low-density parity-check (LDPC) code can be used to encode data packets in wireless transmission. At a wireless receiver, when a wireless signal is received, the received signal can be decoded via a maximum likelihood decoding scheme implemented via an iterative decoding process. The more iterations the LDPC decoder employs, the better the decoding performance may be. However, the available decoding time for a codeword (CW) or a data packet is limited. For example, for a normal guard interval (GI) under the 802.11 standard, the decoding time for each symbol is 0ps. For a short GI, the decoding time for each symbol is 3.6 μs. Thus, a tradeoff can exist between the decoding time and the decoding performance.

In the current systems, the iteration number of a LDPC decoder is determined using an average number based on empirical data. For example, an average number of iterations for a noisy CW received in the wireless signal is 5 iterations. Different signal quality may lead to different decoding performance. For a low-noise corrupted CW, a small number of decoding iterations can achieve successful decoding results; for a noisy CW, more iterations may be needed. Thus, using the same number of iterations for all received CWs can be inefficient for low-noise corrupted CWs, and inaccurate for high-noise corrupted CWs.

SUMMARY

Systems and methods described herein provides a method for dynamically allocating an iteration number for a decoder. The method includes receiving, at an input buffer, an input signal including at least one data packet. The method further includes calculating a first iteration number for decoding the at least one data packet. The method further includes monitoring at least one of available space of the input buffer and available decoding time for the at least one data packet. The method further includes dynamically adjusting the first iteration number to a second iteration number based on the available space or the available decoding time to continue decoding the at least one data packet.

In some implementations, the at least one data packet includes one or more symbols, and the one or more symbols are encoded into one or more codewords.

In some implementations, calculating the first iteration number includes using a register defined maximum iteration value. Calculating the first iteration number further includes determining a number of decoding cores based on a number of symbols in the at least one data packet, a number of codewords in the at least one data packet, or a type of an encoding scheme of the at least one data packet, and determining an average iteration number based on the number of decoding cores.

In some implementations, the method further includes monitoring remaining iterations to be run for an un-decoded codeword included in the at least one data packet.

In some implementations, dynamically adjusting the first iteration number to the second iteration number includes increasing the first iteration number when there is enough decoding time, reducing the first iteration number when a guard interval associated with the at least one data packet is short, or reducing the first iteration number when the input buffer is near full.

In some implementations, the dynamically adjusting further includes reducing the first iteration number for a remaining un-decoded codeword in the at least one data packet during a last symbol period.

In some implementations, the dynamically adjusting further includes determining that there is insufficient time for a last symbol in the at least one data packet, and stopping decoding the at least one data packet.

In another embodiments, systems and methods described herein provides a system for dynamically allocating an iteration number for a decoder. The system includes an input buffer that receives an input signal including at least one data packet. The system further includes an iteration control unit that calculates a first iteration number for decoding the at least one data packet, monitors at least one of available space of the input buffer and available decoding time for the at least one data packet, and dynamically adjusts the first iteration number to a second iteration number based on the available space or the available decoding time to continue decoding the at least one data packet.

BRIEF DESCRIPTION OF THE DRAWINGS

Further features of the disclosure, its nature and various advantages will become apparent upon consideration of the following detailed description, taken in conjunction with the accompanying drawings, in which like reference characters refer to like parts throughout, and in which.

DETAILED DESCRIPTION

This disclosure describes methods and systems for dynamic iteration control for an LDPC decoder. According to this disclosure, the maximum iteration number or limit of the iterative decoding scheme to decode an LDPC CW received at a wireless receiver can be dynamically configured and adjusted, based on monitoring the available input buffer space, and/or the available decoding time. For example, instead of using a fixed number of iterations to decode all incoming data packets or all data symbols received in a data packet, the decoder at the wireless receiver may reduce the iterations when the input buffer is near full, or the available decoding time is limited (e.g., when the decoding has taken a time period close to the GI); or the decoder may allow more iterations to improve decoding accuracy when the input buffer has sufficient space to receive incoming data traffic, or the remaining available decoding time is sufficient. In this way, the iteration limit can be dynamically determined or adjusted to avoid packet loss due to buffer congestion, and to improve decoding performance by allowing the maximum possible iterations. Any or all of the blocks or layers described in the disclosure can be implemented by software instructions encoded on transitory or non-transitory computer-readable media.

Figure 1:
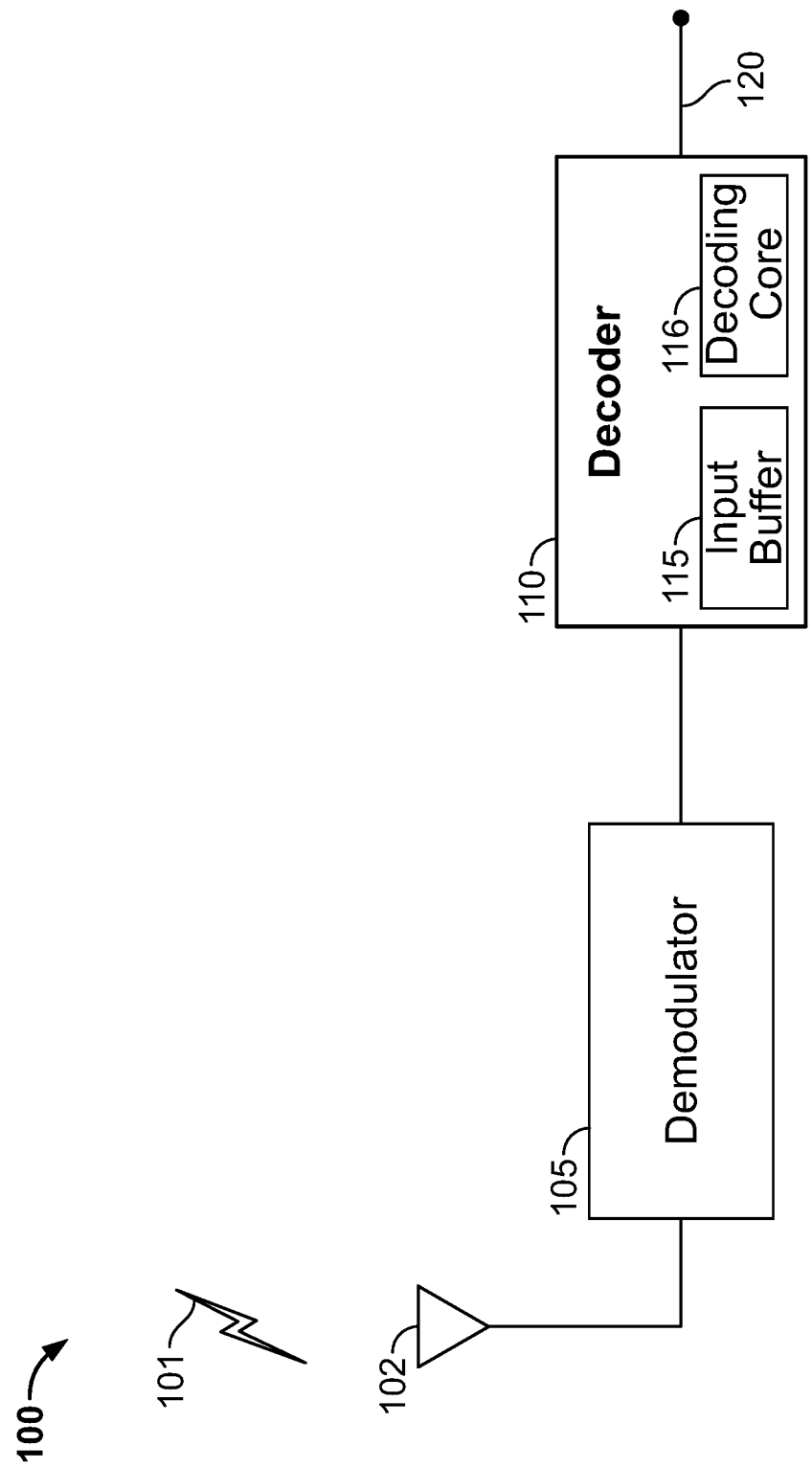
FIG. 1 provides an exemplary block diagram illustrating an example wireless receiver system 100 that includes a LDPC decoder.

FIG. 1 provides an exemplary block diagram illustrating an example wireless receiver system 100 that includes an LDPC decoder. The embodiments described herein may be implemented at a wireless receiver system 100, which can be used in a wireless data transmission system within a wireless network. For example, wireless networks can include, but not be limited to, a WiFi network, a 3G/4G cellular network, a Bluetooth network, and/or the like. A wireless signal 101 may be received at the receiver 102. The received signal can be demodulated at a demodulator 105, and be sent to a decoder 110. The decoder 110 may include an input buffer 115 to store the received data packets/symbols, and a decoder core 116. The decoder core 116 can adopt an iterative decoding procedure to decode the received data symbols.

For example, CWs from the demodulator 105 can be buffered at the input buffer 115. If the arriving CW has an available buffer (buffer that is empty or has been processed and can be written to again), then the CW is placed in one of the empty buffers. The CW currently under decoding can continue. If there are no empty buffers (e.g., all occupied), then the currently decoded CW can be terminated. In such a case, the buffer locked for decoding the current CW may be forced to get freed by aborting or terminating the decoding before the new CW arrives. For another example, not all CWs may need a same amount of decoding time. The decoding of some CWs can be accomplished in a small number of iterations to return a found CW. Thus, the decoding time that would be allocated to these CWs may be distributed to other CWs that may need more iterations to improve decoding efficiency. In general, the more buffers that are available or the more decoding time that is allowable, the more iterations that can be performed for decoding.

Figure 4:
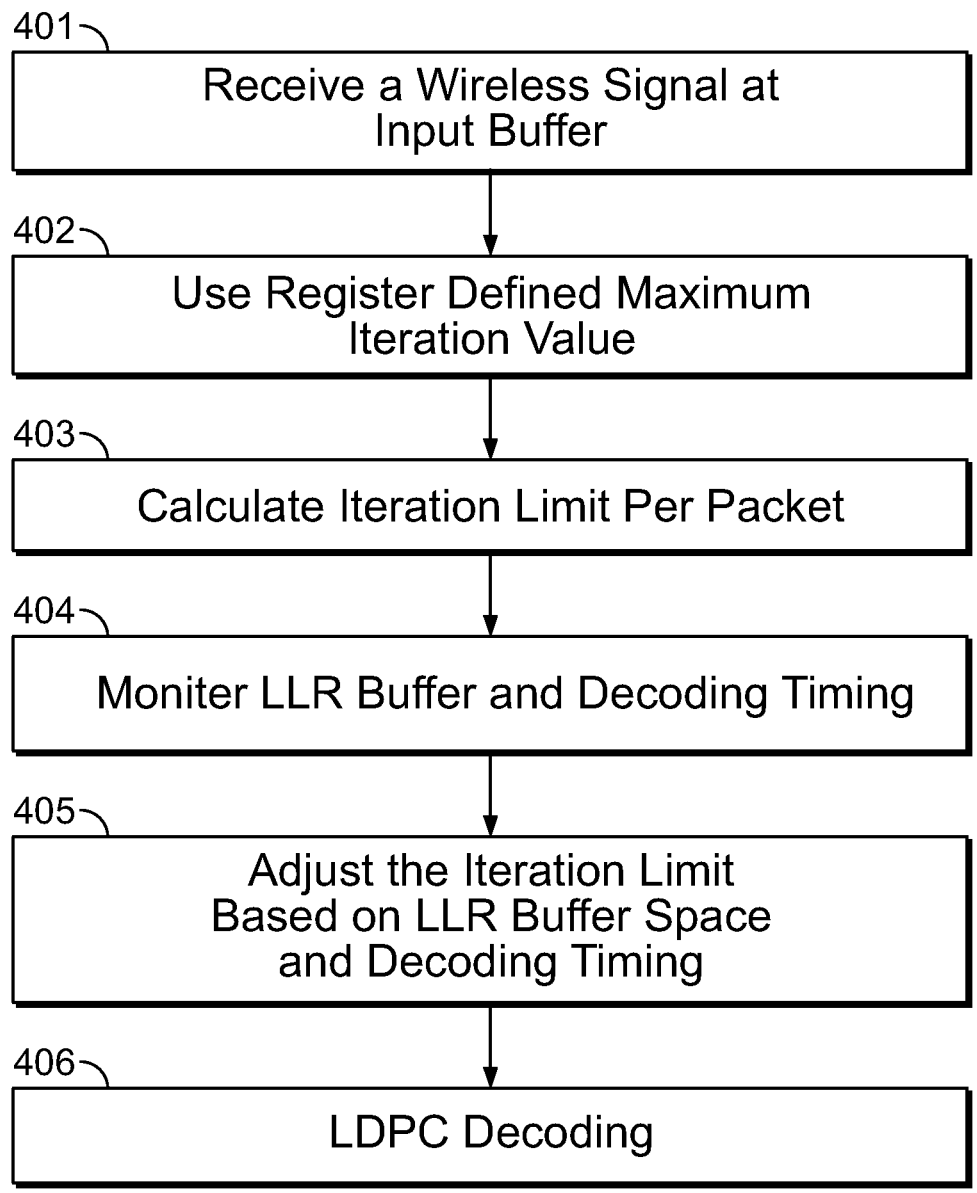
FIG. 4 provides an exemplary logic flow diagram illustrating aspects of dynamic iteration number control for an LDPC decoder.
Figure 5:
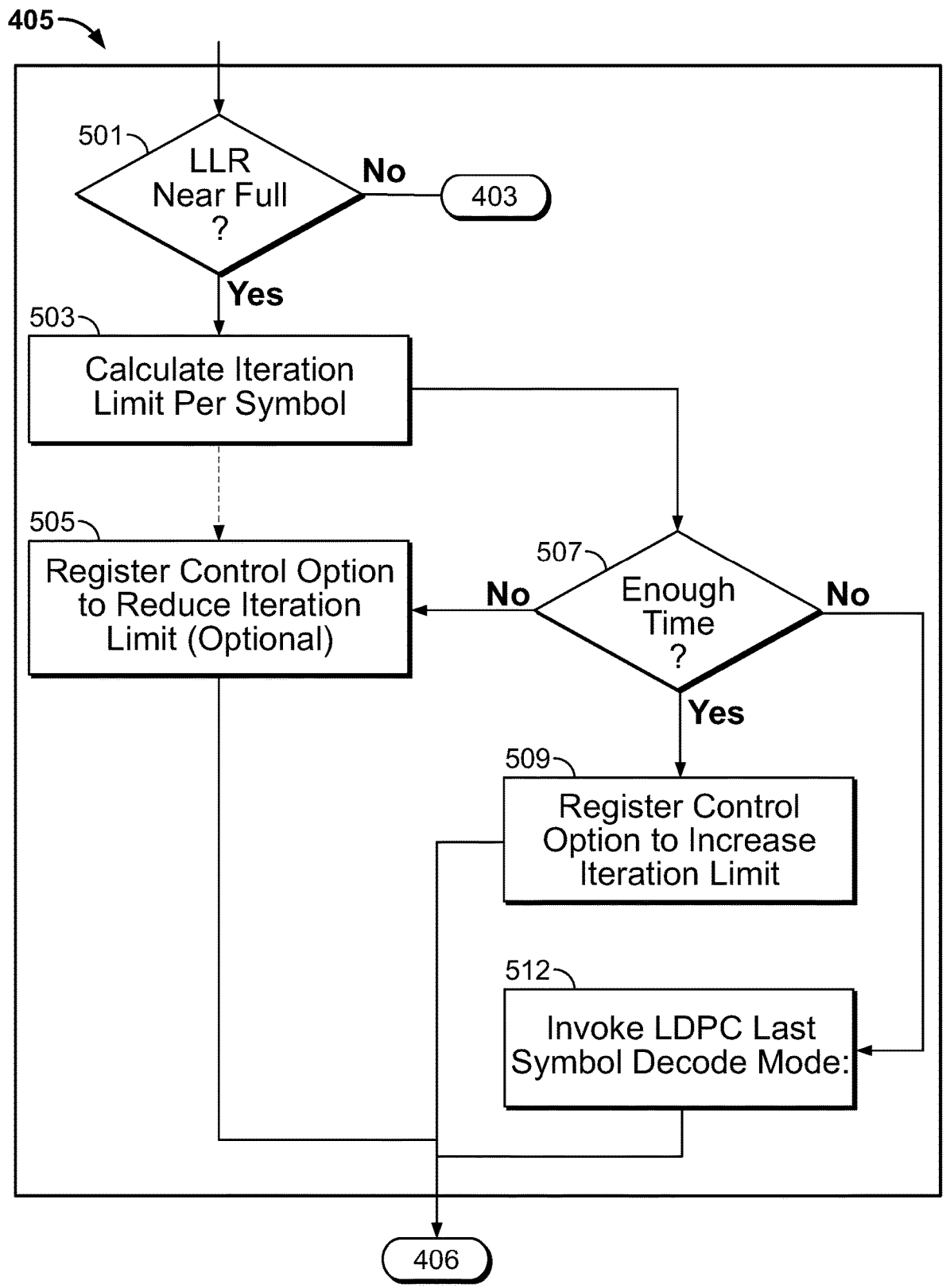
FIG. 5 provides an exemplary logic flow diagram illustrating aspects of adjusting an iteration limit based on the logarithmic likelihood ratio (LLR) buffer space and decoding time (e.g., 405 in FIG. 4).
Figure 6:
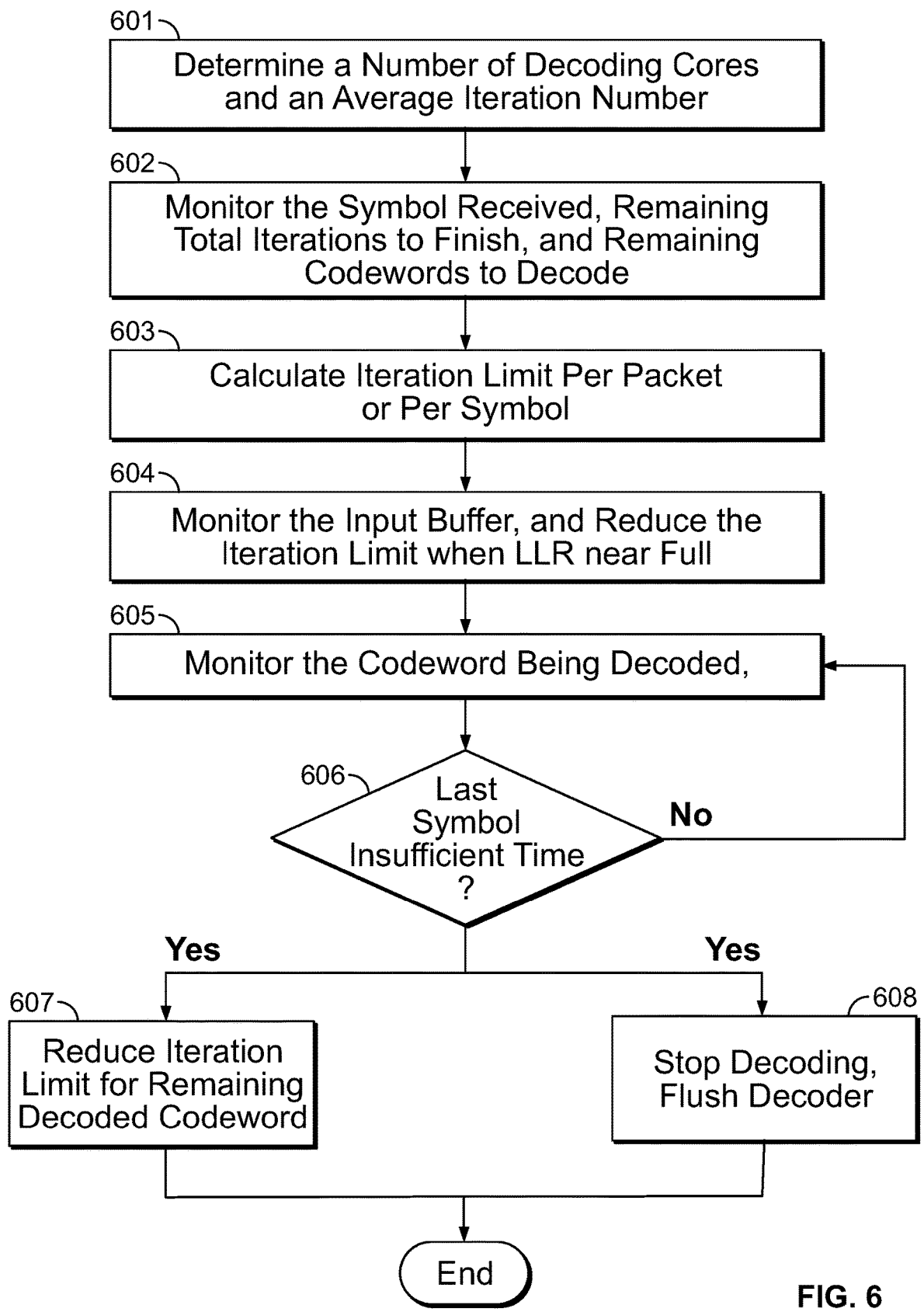
FIG. 6 provides an exemplary logic flow diagram illustrating aspects of dynamic iteration control functions (e.g., realized in the rx_iter_ctrl module 310 in FIG. 3).

In one implementation, the decoding core 116 can dynamically set and/or adjust an iteration limit for the decoding process to improve decoding resource efficiency, as further illustrated in FIGS. 4-6.

In another implementation, the decoder 110 may employ a dynamic input buffer scheduling scheme to reduce decoding latency, as further illustrated in FIGS. 7-12. For example, a group of input buffers can take turns to decode or receive an incoming CW such that a CW in one of the input buffers can take a maximum amount of decoding time, as long as other input buffers are available to receive the new CW.

When a CW is found at the decoding code 116, the decoded data bits 120 may be output to a processor for further data processing.

Figure 2:
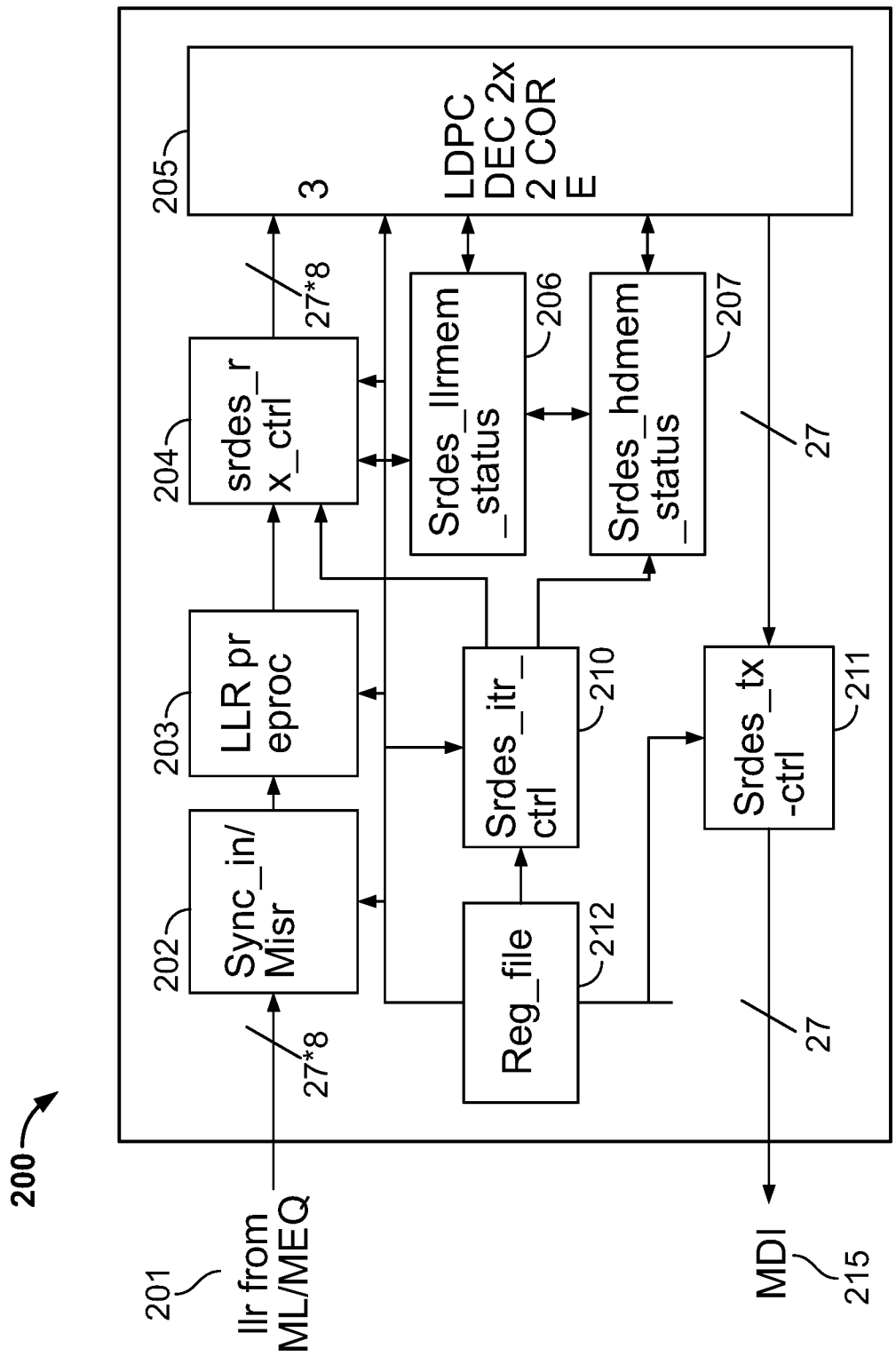
FIG. 2 provides an exemplary block diagram illustrating an infrastructure of a wireless receiver decoding block 100 for LDPC decoding.

FIG. 2 provides an exemplary block diagram illustrating an infrastructure of a wireless receiver decoding block 200 for LDPC decoding. The decoding block 200 can receive a LLR input value 201 for a CW, which may be passed from a demodulator. The LLR input 201 may then be transmitted to a Sync_in/Misr module 202, which includes a signature auto-test function of the LDPC decoder cores 205. Thus, the LLR inputs 201 can either come from outside (e.g., a demodulator 105 in FIG. 1) or generated from inside (e.g., based on auto-testing of the LDPC decoder cores 205).

The LLR preprocessing module 203 may preprocess the received LLR values (e.g., dynamic adjustment of the LLR values, etc.), and send the preprocessed LLR values to the srdes_rx_ctrl module 204. The srdes_rx_ctrl module 204 may then accept the input LLR for each CW, and allocate one of the three LDPC decoder cores 205 for decoding the instant CW. The srdes_rx_ctrl module 204 may then determine how to put the LLR values into a CW, and may then allocate one LLR memory unit (included in the LDPC decoder core 205, not shown in FIG. 2) associated with the selected LDPC decoder core, and two Hard Decision (HD) memory units (included in the LDPC decoder core 205, not shown in FIG. 2) storing HD decoding results of the selected LDPC decoder core, to accomplish the decoding job. The srdes_llrmem_status module 206 can include a dynamic memory management unit to monitor the LLR memory occupation, e.g., 9 LLR memory units can be used for the 3 LDPC decoder cores 205 (3/core) in FIG. 2. The srdes_h-dmem_status module 207 can monitor the HD memory unit occupation, e.g., 24 HD memory units can be used for the 3 LDPC decoder cores 205 (8/core) in FIG. 2. The srdes_h-dmem_status module 207 further monitors what to read-in or read-out from the HD memory and what is available after decoding is accomplished.

The srdes_itr_ctrl module 210 may check the availability of LDPC decoder core and memory, and whether there is CWs waiting to be decoded, then send requests to ask for an extra HD working memory to start a new CW decoding process. The reg_file module 212 may manage all the control registers used in the LDPC decoder cores 205, and may send register data to the sync_in/misr module 202, LLR preprocessing module 203, srdes_rx_ctrl module 204, and srdes tx ctrl module 211. The srdes tx ctrl module 211 may control and send out the decoded bits 215 to a modem data interface (MDI) for processing when a CW is being decoded at the LDPC decoder cores 205, and may release the occupied LLR and HD memory units accordingly.

The LDPC decoder cores 205 may employ an iterative procedure to decode received symbols, for example, layered belief-propagation (BP) decoding, min-sum (MS) decoding, and/or the like. The iteration limit (e.g., the number of iterations to be run by the LDPC decoder cores 205) can be set by the rx_iter_ctrl module 310 in FIG. 3. The LDPC decoder core 205 may terminate decoding early before reaching the iteration limit. For example, the LDPC decoder may terminate decoding early when a CW is found. For another example, the decoding may be abandoned when the calculated syndrome weight after a number of iterative cycles exceeds a programmable threshold (e.g., the LDPC decoder core may abandon the decoding job if after 16 iterations, the syndrome weight is beyond a tolerable threshold). The syndrome weight calculated at each iterative cycle can be a precursor to the probability of decoding convergence. A large intermediate syndrome weight indicates that the probability of convergence will be very low, and the LDPC decoder core 205 may abort decoding in order to save power.

Figure 3:
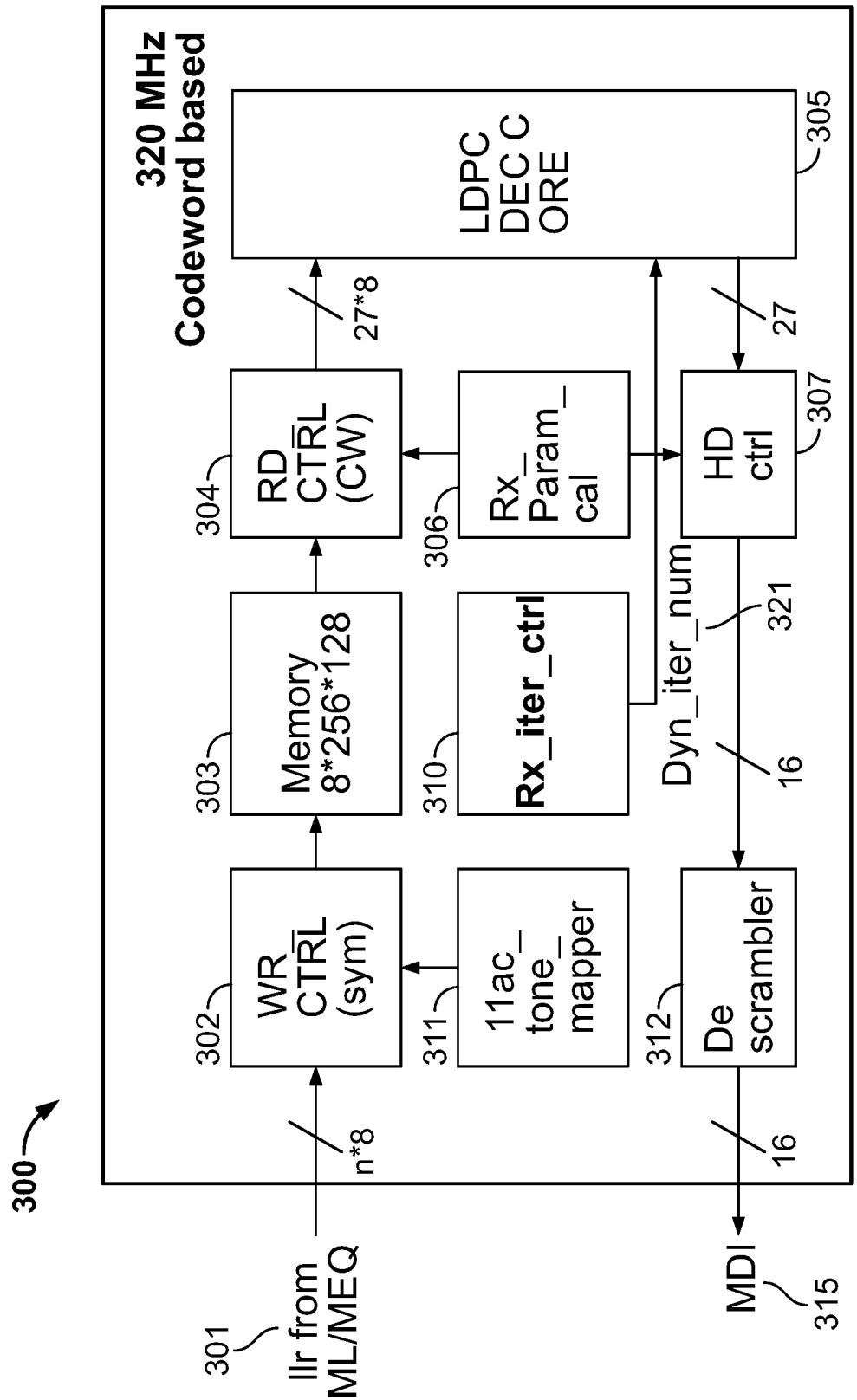
FIG. 3 provides an exemplary block diagram illustrating an infrastructure of a wireless receiver decoder block 300 including an iteration control unit 310 for LDPC decoding.

FIG. 3 provides an exemplary block diagram illustrating an infrastructure of a wireless receiver decoder block 300 including an iteration control unit 310 for LDPC decoding. Similar to the decoder structure 200 in FIG. 2, the decoder block 300 may receive a LLR input 301 per each symbol at an input buffer wr_ctrl 302, which may write data to an 8×256×128 memory per symbol. A tone-mapper module 311 may be adopted to perform tone mapping under 802.11ac, and may be bypassed under 802.11n. The rd_ctrl module 304 may read data from memory 303 per CW, and restructure data for shortening, puncturing, or repetition.

The rx_param_cal module 306 may calculate modulation and coding scheme (MCS) and LDPC parameters, such as the number of symbols, CWs, shortening bits, repeating bits, puncturing bits, and/or the like. The RX_ITER_CTRL module 310 may dynamically control the iteration numbers of LDPC decoding, and send the dynamically-set iteration number 321 to the LDPC decoder code 305. The LDPC decoder core 305 can then use and schedule 3 2×2 LDPC dec core to decode up to 6 CWs at the same time. The HD ctrl module 307 can get 27 bits/cycle from the LDPC decoder core 305, remove shortening bits, and send 16 bits/cycle to the descrambler 312. The descrambler 312 may then output every cycle to MDI throughput 315, e.g., at 320 MHz.

FIG. 4 provides an exemplary logic flow diagram illustrating aspects of dynamic iteration number control for a LDPC decoder. The work flow shown in FIG. 4 may be performed by an iteration control unit such as the rx_iter_ctrl module 310 in FIG. 3. Starting at 401, a LDPC decoder may receive a wireless signal at an input buffer. The wireless signal may include multiple data packets, each of which may further include multiple data symbols encoded in CWs. The LDPC decoder may use a register (e.g., 102 in FIG. 1) defined maximum iteration value to start decoding, at 402. An iteration control unit (e.g., 310 in FIG. 3) of the LDPC decoder may calculate an iteration limit per data packet, at 403, e.g., when the LLR buffer (e.g., inside 205 in FIG. 2) has sufficient space. The iteration control unit may switch to allocate an iteration limit per symbol when the LLR buffer is near full.

The iteration control unit may monitor the LLR buffer and available decoding time, at 404. For example, for each decoding cycle, for a normal GI under the 802.11, the decoding time for each symbol is 0ps. For a short GI, the decoding time for each symbol is 3.6 μs. The iteration control unit may then adjust the iteration limit based on the available LLR buffer space and decoding time, at 405, and then use the adjusted iteration limit for LDPC decoding, at 406.

FIG. 5 provides an exemplary logic flow diagram illustrating aspects of adjusting an iteration limit based on the LLR buffer space and decoding time (e.g., 405 in FIG. 4). When the LLR buffer is near full (e.g., 75%, 80% full or any other percentage) at 501, the iteration control unit may calculate an iteration limit per symbol instead of per packet, at 503. The iteration control unit may optionally (as shown at the dashed line from 503 to 505) revoke a register control option to reduce iteration limit, at 505. Otherwise, when the LLR buffer has sufficient remaining space, the iteration limit per packet may be calculated, e.g., as shown at 403 in FIG. 4.

The iteration control unit may also monitor the decoding time per decoding cycle. When there is enough time for the remaining undecoded CWs at 507, the iteration control unit may invoke a register control option to increase iteration limit (e.g., by 1, etc.) Or alternatively, when there isn't enough time at 507, e.g., within a short GI, the iteration control unit may proceed with 505 to reduce iteration limit. Specifically, when the decoding time is insufficient at 507 and the last symbol of the decoding cycle is being decoded, the LDPC decoder may invoke a last symbol decode mode to force a termination of the decoding and flush the decoder within a short period of time, e.g., within 4-10 μs.

FIG. 6 provides an exemplary logic flow diagram illustrating aspects of dynamic iteration control functions (e.g., realized in the rx_iter_ctrl module 310 in FIG. 3). An iteration control unit may determine a number of decoding cores (e.g., 205 in FIG. 2) and an average iteration number (e.g., based on empirical data), at 601. The iteration control unit may further monitor, for a symbol received, the remaining total iterations to be finished, and the remaining CWs to be decoded, at 602. The iteration control unit may then calculate an iteration limit per packet or per symbol, e.g., depending on whether the LLR buffer is near full (as discussed in FIG. 5), or whether the remaining time is enough for decoding the remaining uncoded CWs, at 603, At 604, the iteration control unit can monitor the input buffer and reduce the iteration limit when the LLR is near full. At 605, the iteration control unit can monitor the CW being decoded. When the decoding is performed on a last data symbol and there is insufficient time to decode (e.g., reaching a time limit) at 606, the iteration control unit may reduce an iteration limit for the remaining undecoded CWs at 607, and/or stop decoding and flush the decoder at 608. Or otherwise, if there is sufficient time to decode at 606, the iteration control unit may continue monitoring the CW being decoded at 605.

The dynamic iteration control discussed in FIGS. 4-6 can be illustrated in the following numerical example. For an LDPC coder with parameters: bandwidth (BW)=160 MHz, number of spatial stream (Nss)=3, MCS=8, LDPC length 1944, rate ¾, number of coded bits per symbol (NCBPS) =11232, 6 CWs, 3 cores, 6 ldpc decoder (e.g., the decoder 2×2 core 205 in FIG. 2 is a dual processor for decoding 2 CWs at the same time, and thus 3 cores could have 6 decoders), 1 iteration time=0.588 ρs, 7 average iterations for decoding when GI=0ps, or 6 average iterations when GI=3.6 μs. An initial maximum iteration number can be set to be 16, when the number of symbols N_sym=5, number of CWs N_CW=29 with a short GI. During the first 4 symbol period, the dynamic iteration limit can be adjusted (e.g., by 310 in FIG. 3) to 8. The first 15 CWs can be decoded using 8 iterations. At the start of last symbol period, 16 CWs remain undecoded, and 17 CWs are not being sent out. So the dynamic iteration limit can be reduced to 6, and then the remaining CWs are decoded with 6 iterations.

FIGS. 7-13 provide exemplary block diagrams illustrating aspects of an input buffer scheduling mechanism for an LDPC decoder (e.g., 110 in FIG. 1). Under the multimedia on coax alliance (MoCA) standard, in order to keep the decoder busy at all times, an input buffer management scheme can require at least two buffers working in a ping-pong fashion, e.g., known as the ping-pong mechanism. For example, assuming a high CW rate scenario where one CW is received per orthogonal frequency-division multiplexing (OFDM) symbol, one input buffer receives a first CW 0 LLR. At the end of LLR delivery for CW 0, the decoder starts decoding CW 0 while the other input buffer receives CW 1 LLR. Then, the first buffer can receive CW 2 LLR's while the decoder decodes CW 1 (which was just received). In the meantime, the first buffer can be used for delivering the hard decisions for CW 0. In this case, the first buffer is used both for delivery of CW 2 LLR's and CW 0 hard decisions. This can be possible if input LLR's and output hard decisions are stored in two physical single-port memories or one dual-port memory (with the write port dedicated to input LLR and the read port dedicated to output hard decisions). So, in the steady state, at any given time, there are three CWs in the pipeline: the LLR's of CW k+1 are being received in the first buffer, CW k is being decoded from the second buffer, and the hard decisions of CW k−1 are being delivered from the first buffer.

Figure 7:
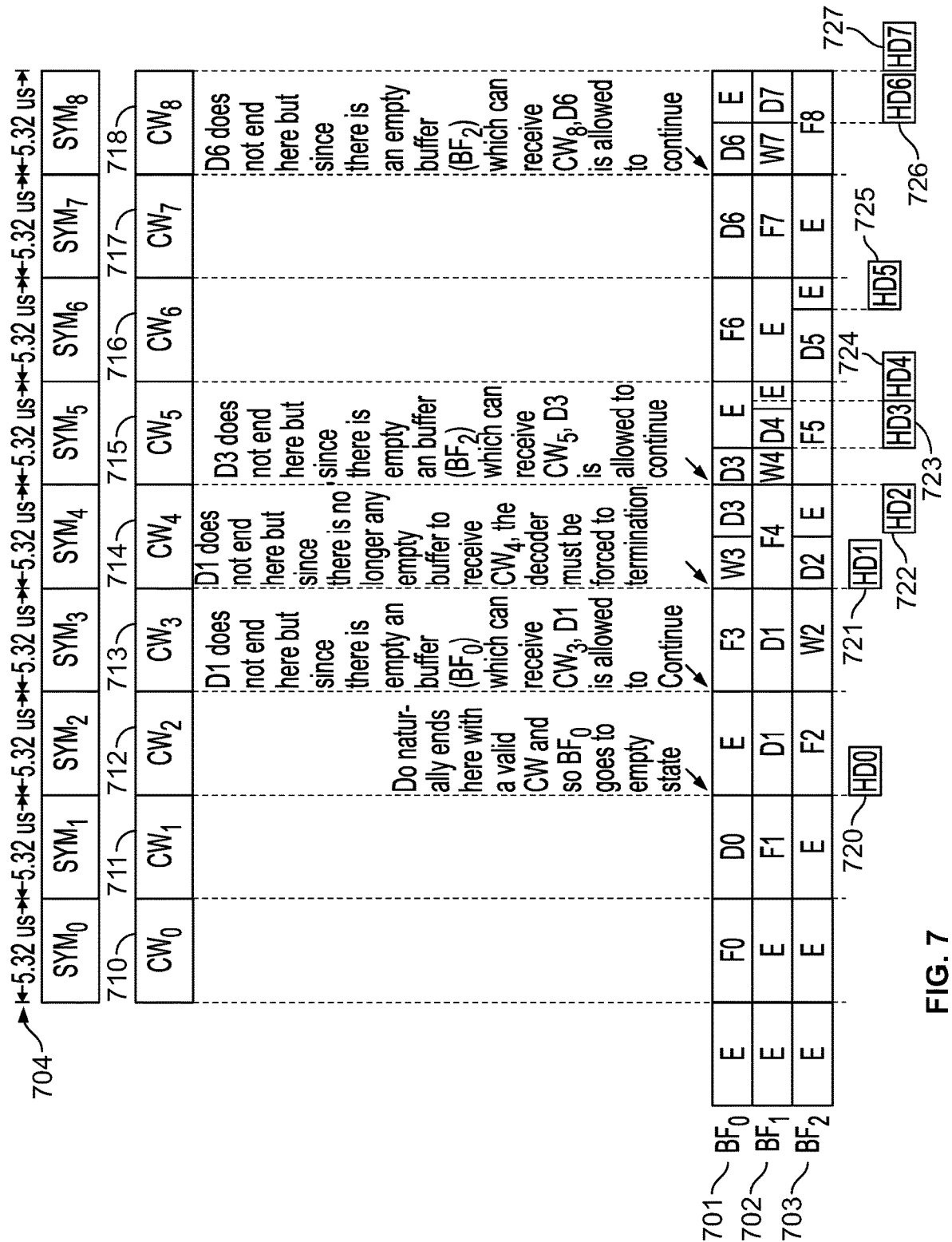
FIGS. 7-13 provide exemplary block diagrams illustrating aspects of an input buffer scheduling mechanism for an LDPC decoder (e.g., 110 in FIG. 1).

The two-buffer ping-pong mechanism may lack flexibility because the time assigned to each CW decoding is constantly fixed (e.g., obtained by the predetermined max number of layers that can be run in one OFDM symbol). Thus, in a low CW rate case, although there may be enough time to run more iterations, the decoder may not be allowed to. FIG. 7 shows a flexible buffer management scheme, based on two or more input buffers that does not require a fixed maximum time assigned to decoding a given CW. For example, as long as an empty buffer able to receive the new upcoming CW is available, the decoder can continue to decode the current CW without interruption. The decoding of a CW can be aborted (forced termination) when a new CW is about to arrive, but no input empty buffer is available to receive it. In this way, the decoder can maximize the decoding time for a CW in both low and high CW rate scenarios.

As shown in FIG. 7, is a set of three input buffers BF0 701, BF1 702 and BF2 703. Each buffer can have one of four states, e.g., Fn-"buffer is being filled with CW n", E-"buffer is empty," Dn-"buffer containing CW n is being decoded," and Wn-"buffer is full with CW n and is waiting to be decoded." The symbol time 704 for each symbol or CW 710-718 is 5.32 µs.

When $CW_0$ 710 arrives, $BF_0$ 701 can receive $CW_0$ 710, and, thus, the state of $BF_0$ 701 changes to "$F_0$," while the states of the other two buffers remains to be "E." When $CW_1$ 711 arrives, $BF_0$ 701 starts to decode $CW_0$ 710 and, thus, the state of $BF_0$ 701 changes to "$D_0$"; $BF_1$ 702 can receive the new $CW_1$ 711, and, thus, the state of $BF_1$ 702 changes to "$F_1$"; and the state of $BF_2$ 703 remains to be "E." At the time when $CW_2$ 712 arrives, if the decoding of $CW_0$ 710 at $BF_0$ 701 is successful, then the state of $BF_0$ 701 would naturally change from "$D_0$" to "E" with a valid HD decoding output (e.g., at 720); the state of $BF_1$ 702 changes to "$D_1$" as $BF_1$ 702 starts decoding $CW_1$ 711; and the state of $BF_2$ 703 changes to "$F_2$" to receive the new $CW_2$ 712.

At the time when $CW_3$ 713 arrives, the empty $BF_0$ 701 may receive the new CW and thus change its state to "$F_3$"; $BF_1$ 702 may continue decoding $CW_1$ 711 and remain in the state "$D_1$" if no successful decoding result has been generated because the empty $BF_0$ 701 can receive the incoming CW; and $BF_2$ 703 enters a state of "$W_2$" to wait for the decoder to be available.

At the time when $CW_4$ 714 arrives, if $BF_1$ 702 still does not accomplish the decoding $CW_1$ 711, as there is no more empty buffer to receive the incoming CW, the decoder is forced to terminate and flush, $BF_1$ 702 will receive $CW_4$ 714 and change its state to "$F_4$." An HD decoding output 721 for $CW_1$ 711 can thus be generated, after which the decoder is available. Thus, $CW_2$ 712 in $BF_2$ 703 can be decoded, and the state of $BF_2$ 703 can change to "$D_2$." If the decoding of $CW_2$ 712 is fast and does not need a whole CW cycle, the decoder can generate an HD decoding output 722 for $CW_2$ 712; and the state of $BF_2$ 703 can change to "E." When the decoding of $CW_2$ 712 is finished, the decoder can start decoding $CW_3$ 713 in $BF_0$ 701, thus changing the state of $BF_1$ 701 from "$W_3$" to "$D_3$."

Similarly, at the time when $CW_5$ 715 arrives, decoding of $CW_3$ 713 can continue because $BF_2$ 703 is currently empty and can receive $CW_5$ 715, and thus change its state to "$F_5$." At $BF_0$ 701, when the decoding of $CW_3$ 713 finished, an HD result 723 can be output, and $BF_0$ 701 can be vacated to an "E" state. Now the decoder is available, $CW_4$ 714 at $BF_1$ 702 can be decoded and output an HD result 724, after which the $BF_1$ 702 is empty with a state "E" again.

Continuing with $CW_6$ 716, $BF_0$ 701 will receive $CW_6$ 716 and change its state to "$F_6$"; $BF_1$ 702 will remain empty; and $BF_2$ 703 can finish decoding $CW_5$ 715, outputting the HD result 725, and change its state from "$D_5$" to "E." When $CW_7$ 717 is received, the empty $BF_1$ 702 can receive $CW_7$ 717 and change its state to "$F_7$"; the $CW_6$ 716 can be decoded and $BF_0$ 701 can change to "$D_6$"; and $BF_2$ 703 can remain empty. When $CW_8$ 718 is received, if decoding of $CW_6$ 716 has not been accomplished, the decoding can continue because the empty $BF_2$ 703 can receive the incoming $CW_8$ 718 and then change its state to "$F_8$." When the decoding of $CW_6$ 716 is finished, the HD result 726 is generated, and $BF_0$ 701 enters an empty state. Now the decoder is available again, and $CW_7$ 717 can be decoded with $BF_1$ 702 changing its state from "$W_7$" to "$D_7$", and outputting an HD result 727 when the decoding is accomplished at the end of the decoding cycle.

In the buffer scheduling process described in FIG. 7, when the buffer state becomes "Wn" and, as soon as the decoder is free, the buffer will immediately obtain the decoder's attention and transition to the state "Dn." As soon as the CW is decoded, the hard decision delivery can start for the decoder. If the current CW being decoded is not done while a new CW is about to arrive, and an empty buffer is available, the decoding of the current CW can continue. However, if no empty buffer to receive the upcoming CW is available, the decoding is forced to termination so the buffer locked for decoding can be freed to receive the upcoming CW. In this way, as shown in FIG. 7, the three buffer mechanism can implement decoding for at least two OFDM symbols without interruption.

In some scenarios the decoding of two CWs may fail consecutively, e.g., after the forced termination of decoding $CW_1$ 711, the decoding of $CW_2$ 712 may take up to one OFDM symbol but fail to decode. This time-budgeting issue could happen when a CW is to arrive soon and if no empty buffer is available, then the decoding is forced to terminate.

Figure 8:
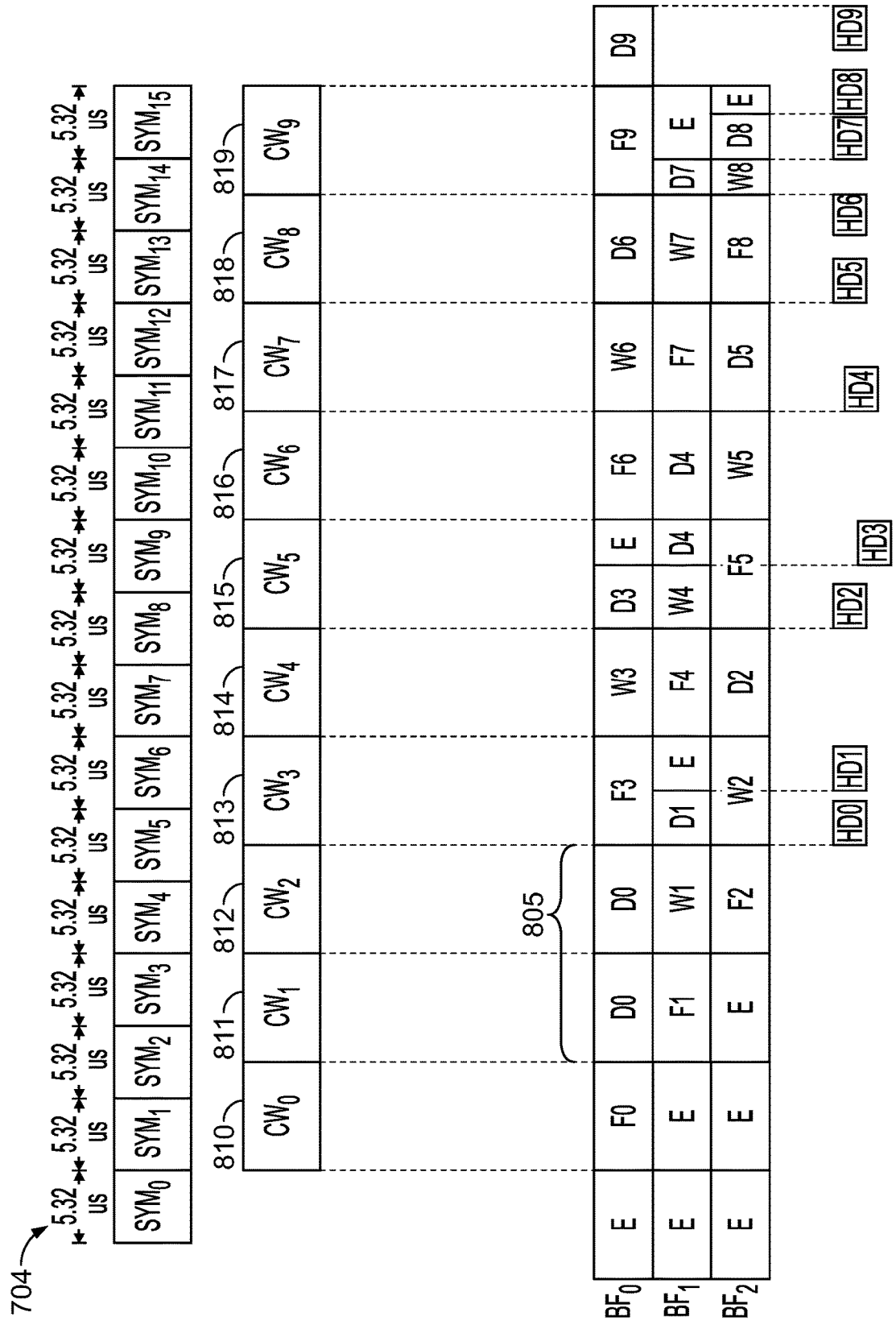

FIG. 8 shows an input buffer management of three input buffers with a low CW rate. When low CW rate, the decoding can take longer time as compared to that in FIG. 7. For example, the decoding time for each CW 810-819 is longer than the OFDM symbol time 704. Thus, the decoder may not need to set a maximum number of iterations, and only force a termination of decoding when no empty buffer is available to receive the new CW. In this case, the decoding can take for as long as 2 CW time, e.g., 805.

Figure 9:
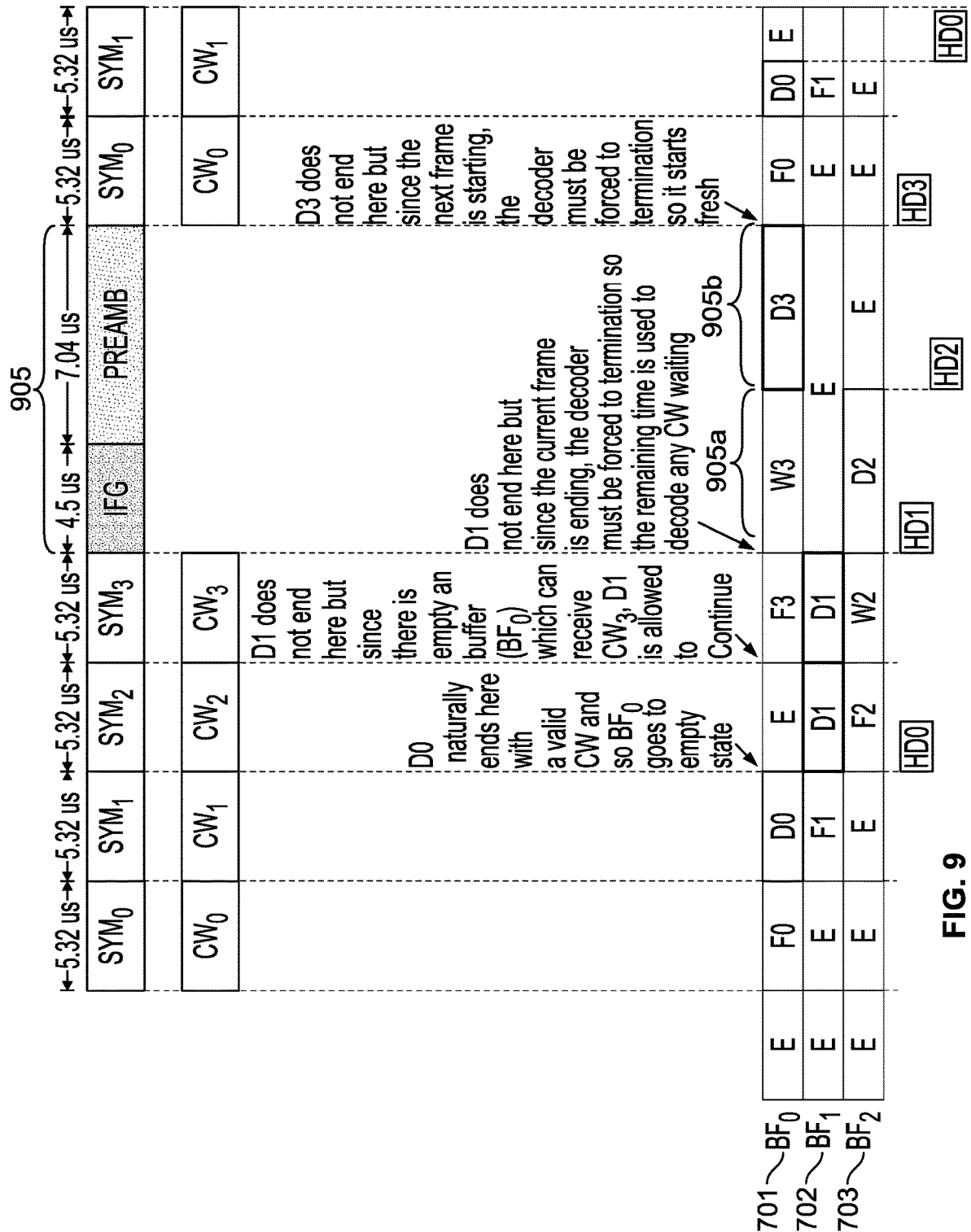

FIG. 9 shows an input buffer management of three input buffers with a high CW rate and back-2-back packets. A time gap of 12-15 µs may exist between consecutive data packets, e.g., see 905. As shown in FIG. 9, at the beginning of the inter-packet gap 905, both $BF_0$ 701 and $BF_2$ 703 contain CWs to be decoded and $BF_1$ 702 has a CW still being decoded. In this case, the inter-packet gap can be uniformly divided as 905a-b between the two CWs that are waiting to be decoded. If the CW just prior to the gap fails, it is unlikely that the subsequent CW (decoded during the gap 905) will fail as well. So decoding time during the gap 905 is usually sufficient. In this way, the CW decoding of the previous packet before the gap 905 can be extended until the end of the LLR delivery of the first CW of the next packet when the first CW of the next packet can start.

Figure 10:
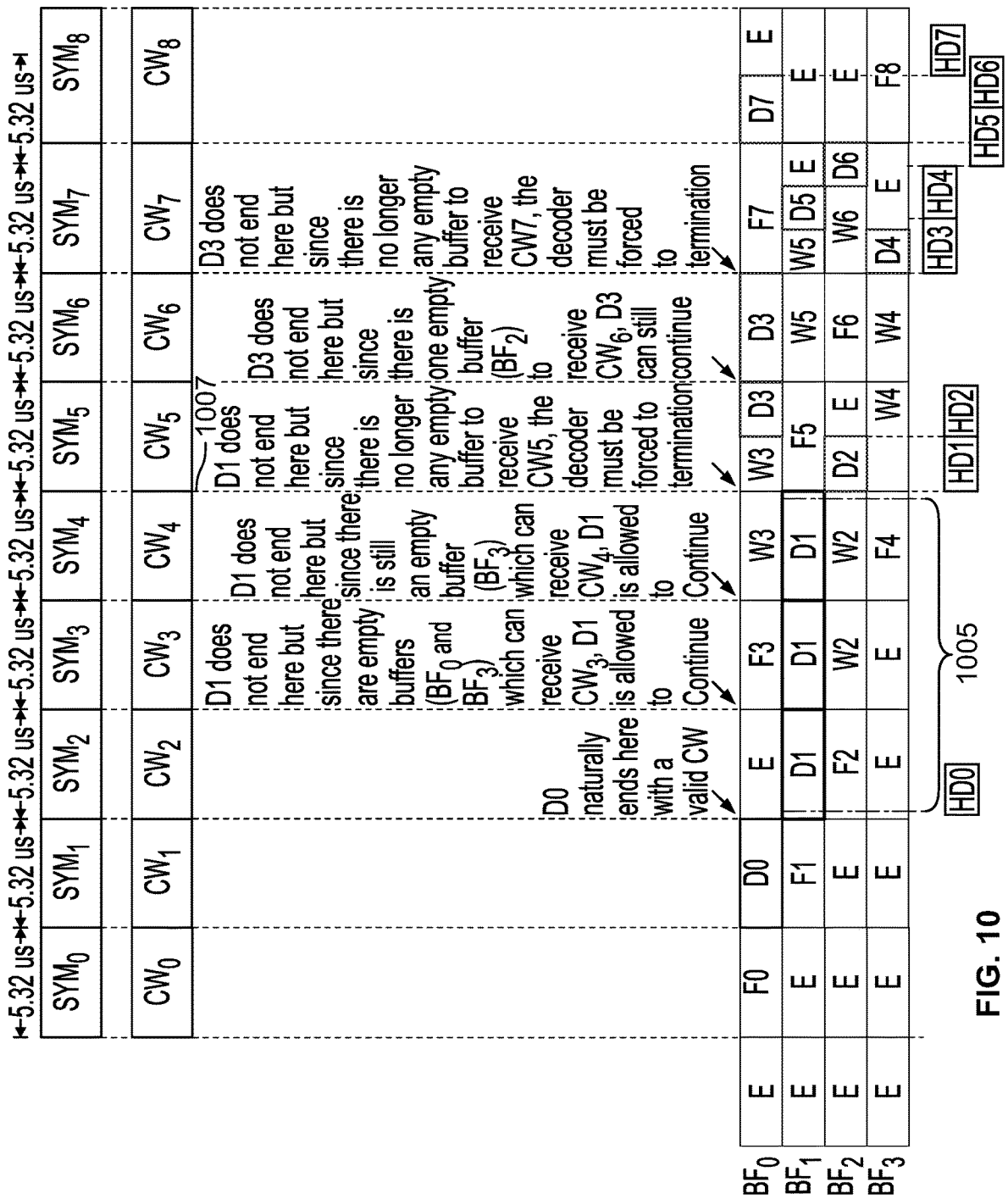

FIG. 10 shows an input buffer management of four input buffers with a high CW rate. When four input buffers are used, the decoding of a given CW can be extended by three symbol time, e.g., see 1005. This is because 3 empty buffers can receive the next three CWs while the current CW is being decoded. Similar scheduling rules may apply as those illustrated in connection with FIG. 7. For example, when a new CW is to arrive and no empty buffer exists, the decoding of the current CW is forced to termination, e.g., see 1007 the end of SYM 4. In general, if one CW fails, unlikely the next CW will fail as well. Therefore, three symbols can be used for decoding a CW unless two consecutive CWs fail. In this case, the second failing CW may be assigned only one symbol. In this way, the input buffer management may automatically adjust the buffer scheduling without having to assign a maximum number of iterations to every CW.

Figure 11:
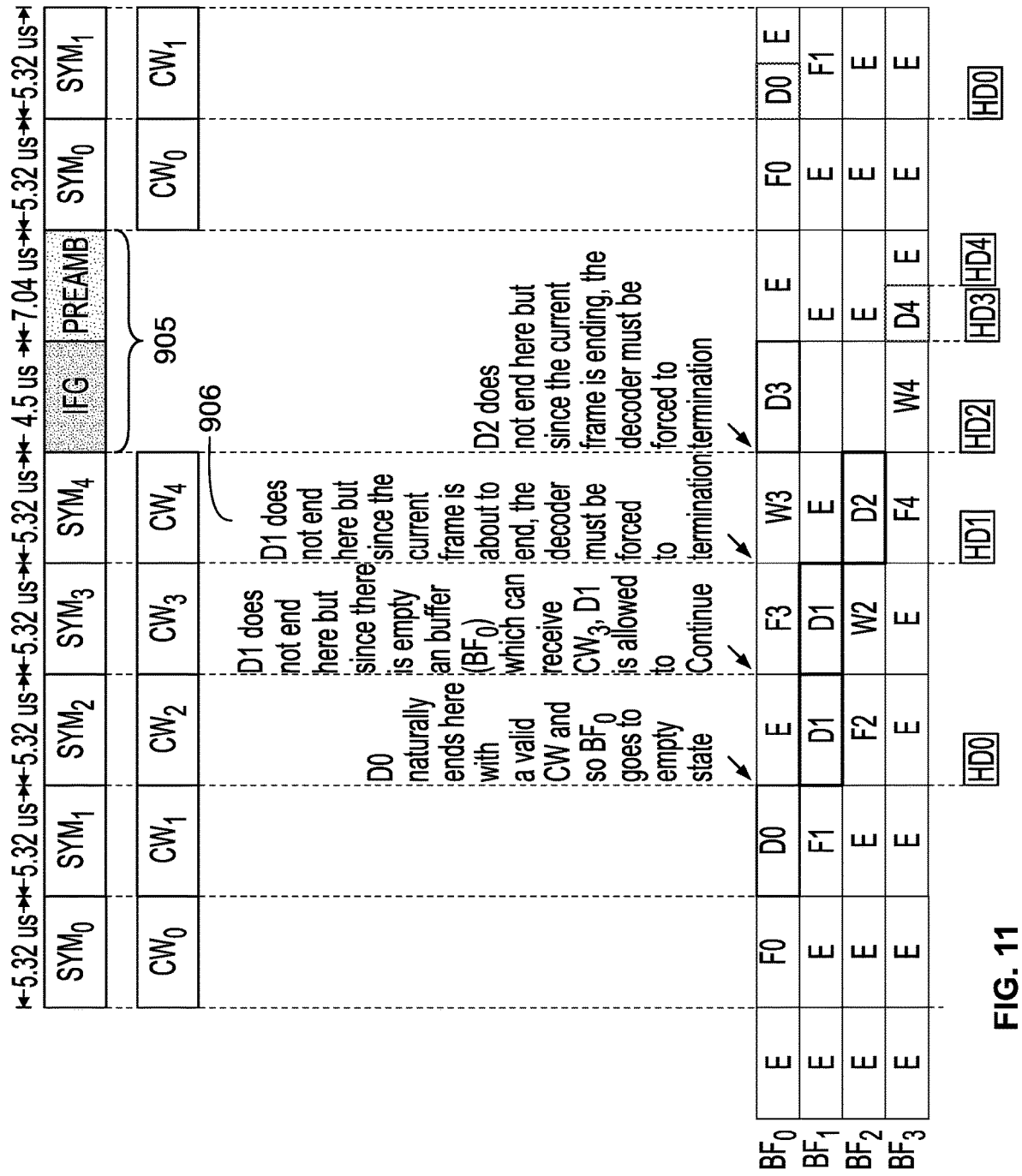

FIG. 11 shows an input buffer management of four input buffers with a high CW rate and back-2-back CW. In the scenario of four input buffers, when a CW is being decoded while three other buffers contain CWs to be decoded, no available buffer can be used to receive a new incoming CW. As the inter-packet gap 905 (between 12 to 15 us) can be limited, if the inter-packet gap is uniformly divided between three CWs, each CW will get around 5 µs, which may not be sufficient.

Alternatively, in view of the upcoming new CW, the decoder may not wait till the end of packet before forcing a termination of the decoding. As shown in FIG. 11, for example, instead of allowing CW1 to continue until the end of SYM4 (e.g., 906), "D1" will be terminated at the end of SYM3 (at 906). This gives a more fair division of the remaining time between all three CWs.

Figure 12:
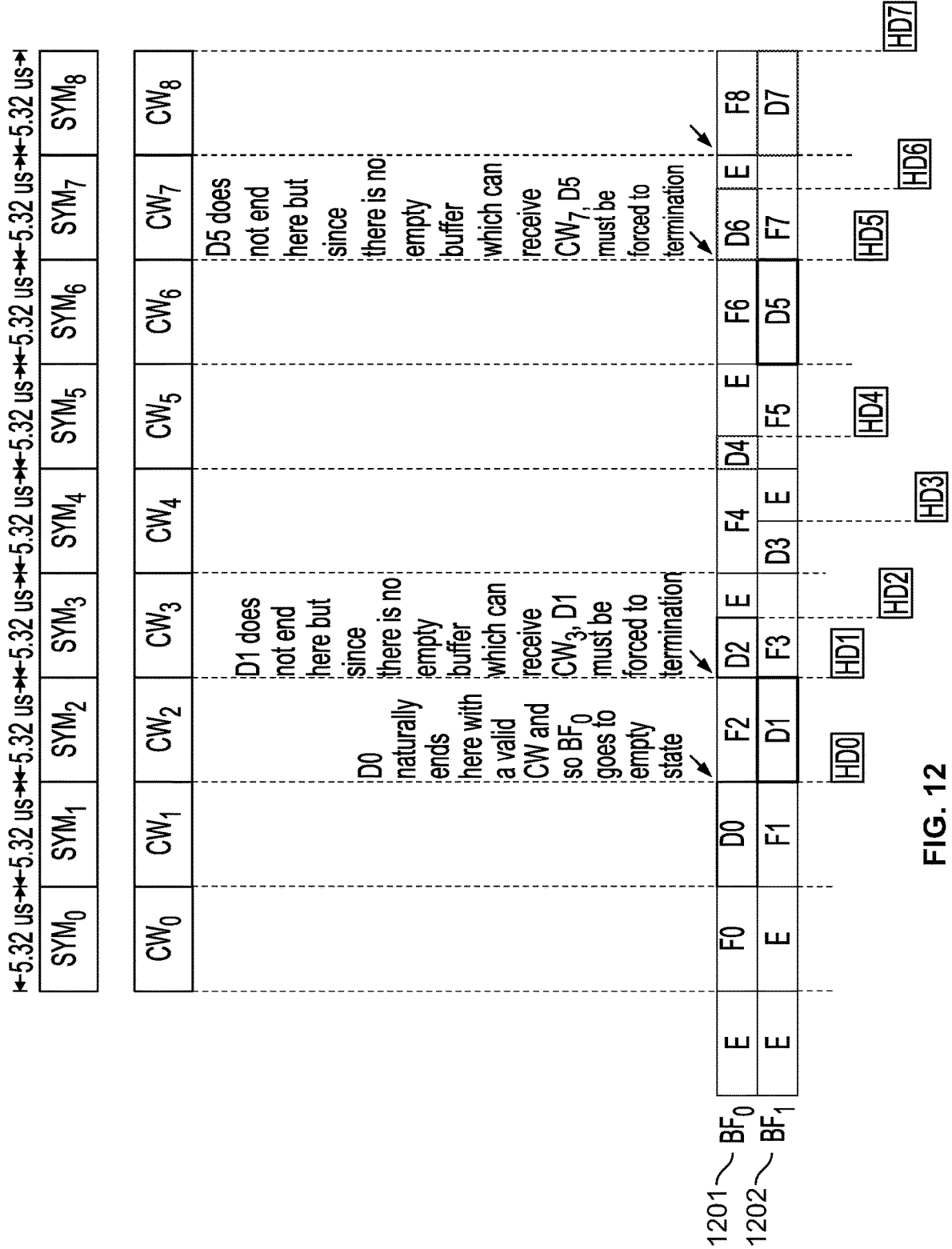

FIG. 12 shows an input buffer management of two input buffers. In this case, input buffers 1201 and 1202 take turns to receive new CWs and decode received CWs, which may resemble the ping-pong mechanism. When two input buffers are used, the maximum number of iterations that can be run is the number that can be accommodated in one OFDM symbol. If three buffers are used, the maximum number of iterations can be the number that can be accommodated in 2 OFDM symbols, e.g., as shown in FIG. 7. In general, if N input buffers are used, the maximum number of iterations can be the number that can accommodated in N–1 OFDM symbols.

The descriptions given in connection with FIGS. 7-12 in the MoCA environment can be applied to any other suitable application where LDPC decoder is implemented. It can be applied in any system where iterations are present, so that the iterative processing can continue until there are no "empty" buffers available to accept new (arriving) CW or task.

Figure 13:
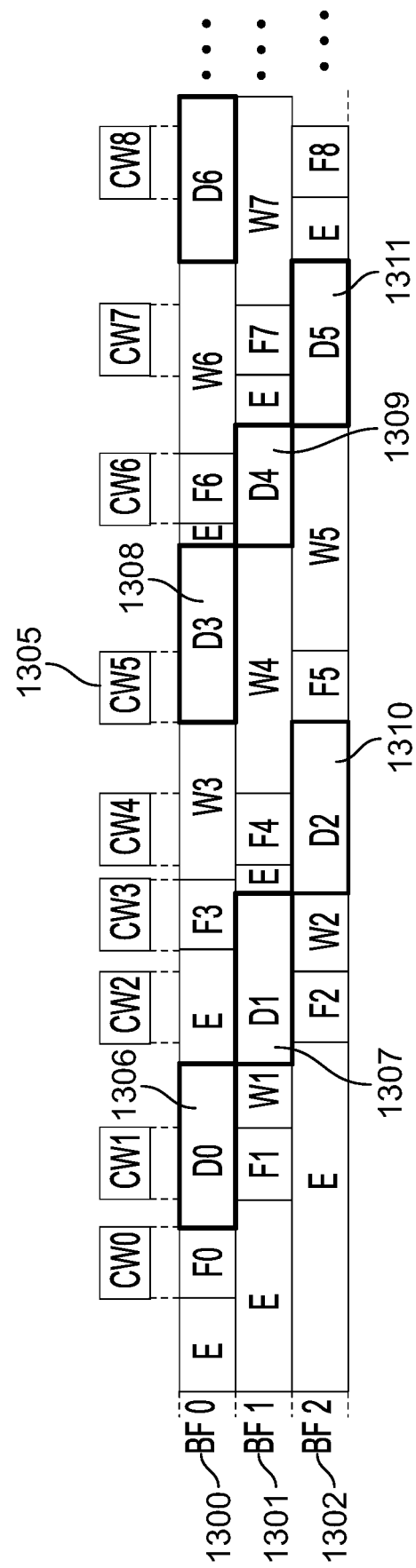

FIG. 13 shows an input buffer management mechanism of three input buffers with asynchronous arrival of CWs. CWs may be arriving in an asynchronous fashion, e.g., instead of regular intervals per CW as shown in FIGS. 7-12, each CW may arrive at different time intervals. Three input buffers 1300-1303 ($BF_0$, $BF_1$ and $BF_2$) are employed. Similar scheduling rules may apply, e.g., when a new CW arrives but no empty buffer is available, the decoding process has to be terminated and the corresponding buffer is released immediately to receive the new CW. For example, as shown in FIG. 13, at the time when $CW_5$ 1305 arrives, $BF_0$ 1300 and $BF_1$ 1301 both have CWs waiting to be decoded, and $BF_2$ 1302 has $CW_2$ being decoded. Thus, when $CW_5$ 1305 arrives, the decoding of $CW_2$ has to be terminated so that $BF_2$ 1302 can be used to receive the new CW, e.g., at 1310. A CW can also be decoded successfully with early termination, e.g., the decoding processes 1306, 1307, 1308, 1309 and 1311 complete before the next CW arrives, and thus the corresponding buffer changes to an empty state.

Although the described scheduling mechanism in FIGS. 7-13 focus on applications in a LDPC decoder, the mechanism may be applied to any system that involves an iterative procedure. For example, the scheduling mechanism can be applied to manage iterations with channel detector in schemes with Turbo-Equalization. For another example, the mechanism can be applied to manage iterations in other iterative decoding schemes such as a Turbo decoder, multi-level decoders implementing iterative decoding steps, decoder/detector iterations, and/or the like.

While various embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure. It is intended that the following claims define the scope of the disclosure and that methods and structures within the scope of these claims and their equivalents be covered thereby.

The foregoing is merely illustrative of the principles of this disclosure, and various modifications can be made without departing from the scope of the present disclosure. The above-described embodiments of the present disclosure are presented for purposes of illustration and not of limitation, and the present disclosure is limited only by the claims that follow.

What is claimed is:

1. A method for dynamically decoding a codeword based on availability of input buffers and available decoding time, the method comprising:
   receiving an input signal including at least one data packet that includes a plurality of codewords to be decoded at a plurality of parallel input buffers;
   monitoring available space of each input buffer from the plurality of parallel input buffers and available decoding time for each codeword that is being decoded at a respective input buffer when at least a first codeword is being decoded at a first input buffer among the plurality of parallel input buffers;
   receiving a second codeword for decoding when the first codeword is being decoded at the first input buffer;

determining a second buffer from the plurality of parallel input buffers to decode the second codeword based on the monitored available space of at least two input buffers among the plurality of parallel input buffers and the monitored available decoding time for each codeword that is being decoded at the respective input buffer; and storing the second codeword from the at least one data packet into the second input buffer for decoding in parallel with the first codeword being decoded at the first input buffer.

2. The method of claim 1, further comprising: calculating a first iteration number for decoding the first codeword from the at least one data packet using a register defined maximum iteration value; dynamically adjusting the first iteration number to a second iteration number based on the available space or the available decoding time to continue decoding the first codeword.

3. The method of claim 2, wherein the calculating the first iteration number includes using a register defined maximum iteration value.

4. The method of claim 3, further comprising: when the at least one data packet includes at least the first codeword and the second codeword, receiving the first codeword and the second codeword asynchronously.

5. The method of claim 3, further comprising: monitoring remaining iterations to be run for an un-decoded codeword included in the at least one data packet.

6. The method of claim 3, further comprising: determining that there is insufficient time for a last symbol in the at least one data packet; and stopping decoding the at least one data packet.

7. The method of claim 2, wherein the calculating the first iteration number includes: determining a number of decoding cores based on a number of symbols in the at least one data packet, a number of codewords in the at least one data packet, or a type of an encoding scheme of the at least one data packet; and determining an average iteration number based on the number of decoding cores.

8. The method of claim 2, wherein the dynamically adjusting the first iteration number to the second iteration number comprises: increasing the first iteration number when there is enough decoding time to decode the first codeword; and reducing the first iteration number when decoding time for a last symbol of the at least one data packet is insufficient to decode the last symbol.

9. The method of claim 2, wherein the dynamically adjusting the first iteration number to the second iteration number comprises: reducing the first iteration number when the input buffer is near full; and reducing the first iteration number for a remaining un-decoded codeword in the at least one data packet during a last symbol period.

10. The method of claim 1, further comprising: receiving a third codeword from the at least one data packet when all the plurality of input buffers are occupied; terminating the decoding of the first codeword to vacate the first input buffer in which the first codeword is stored, such that the plurality of input buffers have vacancy to receive the third codeword from the at least one data packet when all of the plurality of input buffers are employed.

11. A system for dynamically decoding a codeword based on availability of input buffers and available decoding time, the system comprising:

a plurality of parallel input buffers configured to:
  receive an input signal including at least one data packet that includes a plurality of codewords to be decoded;

processing circuitry configured to:
  monitor available space of each input buffer from the plurality of parallel input buffers and available decoding time for each codeword that is being decoded at a respective input buffer when at least a first codeword is being decoded at a first input buffer among the plurality of parallel input buffers;
  receive a second codeword for decoding when the first codeword is being decoded at the first input buffer;
  determine a second buffer from the plurality of parallel input buffers to decode the second codeword based on the monitored available space of at least two input buffers among the plurality of parallel input buffers and the monitored available decoding time for each codeword that is being decoded at the respective input buffer; and
  store the second codeword from the at least one data packet into the second input buffer for decoding in parallel with the first codeword being decoded at the first input buffer.

12. The system of claim 11, wherein the processing circuitry is further configured to: calculate a first iteration number for decoding the first codeword from the at least one data packet using a register defined maximum iteration value; dynamically adjust the first iteration number to a second iteration number based on the available space or the available decoding time to continue decoding the first codeword.

13. The system of claim 12, wherein the processing circuitry is further configured, when calculating the first iteration number includes, to use a register defined maximum iteration value.

14. The system of claim 13, wherein the processing circuitry is further configured to: when the at least one data packet includes at least the first codeword and the second codeword, receive the first codeword and the second codeword asynchronously.

15. The system of claim 13, wherein the processing circuitry is further configured to: monitor remaining iterations to be run for an un-decoded codeword included in the at least one data packet.

16. The system of claim 13, wherein the processing circuitry is further configured to: determine that there is insufficient time for a last symbol in the at least one data packet; and stop decoding the at least one data packet.

17. The system of claim 12, wherein the processing circuitry is further configured, when calculating the first iteration number, to: determine a number of decoding cores based on a number of symbols in the at least one data packet, a number of codewords in the at least one data packet, or a type of an encoding scheme of the at least one data packet; and determine an average iteration number based on the number of decoding cores.

18. The system of claim 12, wherein the processing circuitry is further configured, when dynamically adjusting the first iteration number to the second iteration number, to: increase the first iteration number when there is enough decoding time to decode the first codeword; and reduce the first iteration number when decoding time for a last symbol of the at least one data packet is insufficient to decode the last symbol.

19. The system of claim 12, wherein the processing circuitry is further configured, when dynamically adjusting the first iteration number to the second iteration number, to: reduce the first iteration number when the input buffer is near full; and reduce the first iteration number for a remaining un-decoded codeword in the at least one data packet during a last symbol period.

20. The system of claim 11, wherein the processing circuitry is further configured to: receive a third codeword from the at least one data packet when all the plurality of input buffers are occupied; terminate the decoding of the first codeword to vacate the first input buffer in which the first codeword is stored, such that the plurality of input buffers have vacancy to receive the third codeword from the at least one data packet when all of the plurality of input buffers are employed.

\* \* \* \* \*